United States Patent
Buller et al.

(10) Patent No.: US 7,227,155 B2
(45) Date of Patent: Jun. 5, 2007

(54) ELECTROSTATIC DEFLECTION SYSTEM WITH IMPEDANCE MATCHING FOR HIGH POSITIONING ACCURACY

(75) Inventors: Benyamin Buller, Cupertino, CA (US); William J. Devore, Hayward, CA (US); Juergen Frosien, Riemerling (DE); Eugene Mirro, Jr., San Leandro, CA (US); Henry Pearce-Percy, Los Gatos, CA (US); Dieter Winkler, Munich (DE)

(73) Assignee: Applied Materials, Inc., Santa Clara, CA (US)

( * ) Notice: Subject to any disclaimer, the term of this patent is extended or adjusted under 35 U.S.C. 154(b) by 51 days.

(21) Appl. No.: 11/241,789

(22) Filed: Sep. 30, 2005

(65) Prior Publication Data

US 2007/0075256 A1    Apr. 5, 2007

(51) Int. Cl.
*H01J 37/147* (2006.01)
(52) U.S. Cl. .................................................. 250/396 R
(58) Field of Classification Search .................... None
See application file for complete search history.

(56) References Cited

U.S. PATENT DOCUMENTS

| 4,434,371 | A | * | 2/1984 | Knauer | ..................... 250/396 R |
| 4,922,196 | A | * | 5/1990 | Rigg | ........................... 324/751 |
| 5,208,560 | A | * | 5/1993 | Yasutake | ....................... 333/12 |
| 2003/0089858 | A1 | | 5/2003 | Hotta et al. | |

* cited by examiner

*Primary Examiner*—Jack I. Berman
(74) *Attorney, Agent, or Firm*—Patterson & Sheridan

(57) ABSTRACT

An apparatus and method for deflecting electron beams with high precision and high throughput. At least one electrode of a deflecting capacitor is connected to a signal source via a coaxial cable. A termination resistor is further connected to the coaxial cable and the electrode at the joint of the coaxial cable and the electrode. The termination resistor has a resistance matched to the impedance of the coaxial cable and the electrode has an impedance matched to half of the impedance of the coaxial. The deflecting capacitors of the present invention have a minimized loss of precision due to eddy current. The spacing of electrodes in the deflecting capacitors is reduced by a factor of approximately two compared to the state-the-art system.

20 Claims, 4 Drawing Sheets

ELECTROSTATIC DEFLECTION SYSTEM WITH IMPEDANCE MATCHING FOR HIGH POSITIONING ACCURACY

BACKGROUND OF THE INVENTION

1. Field of the Invention

Embodiments of the present invention generally relate to an electrostatic deflection system used in electron beam systems.

2. Description of the Related Art

An electron beam is a group of electrons that have approximately the same kinetic energy and move in approximately the same direction. Electron beam technologies are used in many fields, such as cathode ray tubes (CRT), lithography, scanning electron microscopes, and welding. Electron beam systems, such as scanning electron microscopes, vector and raster beam lithography systems, usually have an electron beam column, in which at least one deflection system may be used to deflect electron beams, for example, to ensure the beams strike a target specimen at a precise location.

Electron beams are generally deflected by a magnetic or an electric field. An electrostatic deflection system is a system that uses an electric field to deflect the electron beams. Because an electric field is generally faster than an magnetic field in deflecting an electron beam, electrostatic deflection systems are usually used to implement fast deflection and to achieve high throughput in the electron beam systems. The miminal configuration for an electrostatic deflection system consists a capacitor that forms an electric field between two electrodes. The electron beam is deflected as it passes through this electric. Deflection signals are supplied to the capacitor in the form of an electric signal via a transmission line, for example, a high frequency 50 Ohm coaxial cable. The electric signal results in a voltage difference across the distance between two opposing electrodes of the capacitor. The deflection system is generally designed to minimize reflections of the electric signal due to impedance mismatch in the transmission line by selecting components to optimize impedance matching.

In the state-of-the-art deflection systems, impedance matching is done by making the capacitor a part of the transmission line, which means that the capacitor has the same impedance as the transmission line and the signal flows over the capacitor. FIG. 2 illustrates a schematic view of a state-of-the-art deflection system 200. Electrodes 202 and 212 are disposed opposing to one another and form a capacitor 210. The capacitor 210 is configured to deflect an electron beam 201 that passes through between the electrodes 202 and 212. A signal source 203 is adapted to supply a deflection signal to the electrode 202 via a drive coaxial cable 204. Particularly, the signal source 203 is connected to the electrode 202 via a core channel 204a of the drive coaxial cable 204 and an outer channel 204b of the drive coaxial cable 204 is grounded. The electrode 202 is further connected to the ground via a return coaxial cable 205 and a termination resistor 206. As used herein, termination resistor generally refers to any component having a desired impedance and need not necessarily be a resistor. The return coaxial cable 205 and the termination resistor 206 are connected in series. Similarly, the electrode 212 is connected to a signal source 213 via a drive coaxial cable 214 and connected to the ground via a return coaxial cable 215 and a termination resistor 216.

Usually, the drive coaxial cables 204, 214 and the return coaxial cables 205 and 215 are 50 Ohm coaxial cables, and the termination resistors 206 and 216 are equivalent to 50 Ohm resistors. The impedance between each electrode 202 or 212 and the ground is 50 Ohm respectively. Therefore, each electrode 202 or 212 acts as a part of transmission lines formed by the coaxial cables 204-205 and 214-215 respectively. The impedance of virtual coaxial cables 204-202-205 and 214-212-215 matches that of the termination resistors 206 and 216 respectively. The signal source 203 outputs a deflection signal that is inverted to a deflection signal from the signal source 213 such that the resultant voltage across the capacitor 210 to deflect the electron beam 101 is twice the amplitude of each of the signal sources 203 and 213.

During operation, the signal source 203 applies a voltage via drive coaxial cable 204. A current passes along the drive coaxial cable 204, the electrode 202 and the return coaxial cable 205, and then flows to the termination resistor 206. At point 207, the impedance of the virtual coaxial cables 204-202-205 matches the impedance of the termination resistor 206. Thus, reflection of wavefronts is minimized. Similarly, the signal source 213 sends a voltage (inverted of the voltage from signal source 203) down the drive coaxial cable 214. A current passes a long the drive coaxial cable 204, the electrode 212, the return coaxial cable 215 and the termination resistor 216. As discussed above, the impedance between each electrode 202/212 and the ground is 50 Ohm. Since the electrodes 202 and 212 are connected to a pair of inverted voltages, the voltage at the middle points between the electrodes 202 and 212 equals to the ground. Thus, the capacitor 210 may be considered as two capacitors (202-ground, and ground-212) in series each has an impedance of 50 Ohm. Therefore, the impedance of the capacitor 210 is 100 Ohm, or twice of that of the coaxial cable used. Because the impedance of the capacitor is given, among others, by the distance between the two electrodes of the capacitor, the impedance of the capacitor 210 can be adjusted by distance D1 between the electrodes 202 and 212.

FIG. 3 illustrates another state-of-the-art deflection system 200A. For ease of understanding, identical or similar features are identified by the same numerals in FIGS. 2 and 3. The deflection system 200A is similar to the deflection system 200 in FIG. 2. However, only one signal source 203 is used in the deflection system 200A. The electrode 212 is grounded. Therefore, the electrodes 202 and 212 form a capacitor 210A having an impedance matched to that of the coaxial cables 204 and 205. The distance between the electrodes 202 and 212 is D2, which is half of D1 in FIG. 2 if the same kind of coaxial cables are used in both systems.

However, the state-of-the-art electrostatic deflection systems discussed above have several disadvantages. First, because there is a current flows over the electrode into the termination resistor, eddy currents are induced in the neighboring metal areas when the current in the electrode changes with the deflection voltage. The induced eddy-current in turn creates a transient magnetic field which affects the beam deflection. The induced transient magnetic field drives the beam deflection angle causing the deflection system to lose precision, especially when the dwell time of the electron beam is larger than the eddy current transients. The induced magnetic field may also affect the electron beam with a long time constant so that the beam does not settle to a target position for a relatively long time, especially when the time constant of the eddy current is much larger than the dwell time of the beam at one point. Second, two connectors are required for each electrode increasing complexity of the system. Third, a rather large spacing is required between the capacitor electrodes in order to match the impedance of a high frequency cable, which has a standard impedance of 50 Ohm.

Since fast rising, high precision and simplicity are desirable in electron beam systems, a need exists in the art for a method and system for improving electron beam deflection.

SUMMARY OF THE INVENTION

The present invention relates to an apparatus and method for deflecting electron beams with high precision and high throughput.

One embodiment provides an apparatus for deflecting an electron beam. The apparatus comprises first and second opposing electrodes, a first signal source adapted to provide a first deflection signal, a first coaxial cable having a first impedance, wherein a first end of the first coaxial cable is electrically coupled to the first signal source and a second end of the first coaxial cable is electrically coupled to the first electrode, and a first termination component having an impedance matched to the first impedance, wherein a first end of the first termination component is electrically coupled to the second end of the first coaxial cable and a second end of the termination component is electrically coupled to a ground, wherein the first electrode having an impedance relative to the ground matched to approximately half of the first impedance.

Another embodiment provides an apparatus for deflecting an electron beam. The apparatus comprises at least one of a first circuit, each of the first circuit comprising a signal source, a termination component, and a drive cable connecting the signal source and the termination, wherein the drive cable has a first impedance, the termination component is ground and has a resistance matched to the first impedance, and at least one pair of opposing electrodes adapted to deflect the electron beam, wherein one electrode in the at least one pair of electrodes is connected to a respective one of the at least one first circuit such that the electrode is connected to the signal source via the drive cable.

Yet another embodiment of provides a method for providing an electric signal to a deflection system having multiple electrodes. The method comprises providing a first closed circuit, wherein a signal source, a coaxial cable and a termination component are connected in series, connecting one of the electrodes to the first closed circuit at one point, wherein the one point is a joint of the coaxial cable and the termination component, wherein the electrode connected to the first closed circuit and the ground having an impedance matched to a parallel circuit of the coaxial cable and the termination component, and providing a first electric signal using the signal source in the first closed circuit.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention may be utilized to improve electron beam deflection. By connecting a single point of an electrode of a capacitor used to deflect the electron beam to a coaxial drive cable and one end of a termination resistor, current flow across the electrode may be prevented. As a result, the inducement of eddy currents and associated transient magnetic fields may be avoided, thereby leading to more precisely controlled deflection. Further, according to some embodiments, lower total capacitor impedance may be utilized, allowing correspondingly shorter distances between electrodes.

While embodiments of the present invention will be described with reference to an electron beam deflection system, those skilled in the art will recognize that the concepts described herein may be applied to control deflection of a variety of different types of charged particle beams used in a variety of different applications. Further, while 50 Ohm transmission cables are described, those skilled in the art will recognize that transmission cables of other impedance values may be accommodated with corresponding changes in capacitor design (electrode size and spacing) and termination resistors.

An Exemplary Beam Column

Figure 1:
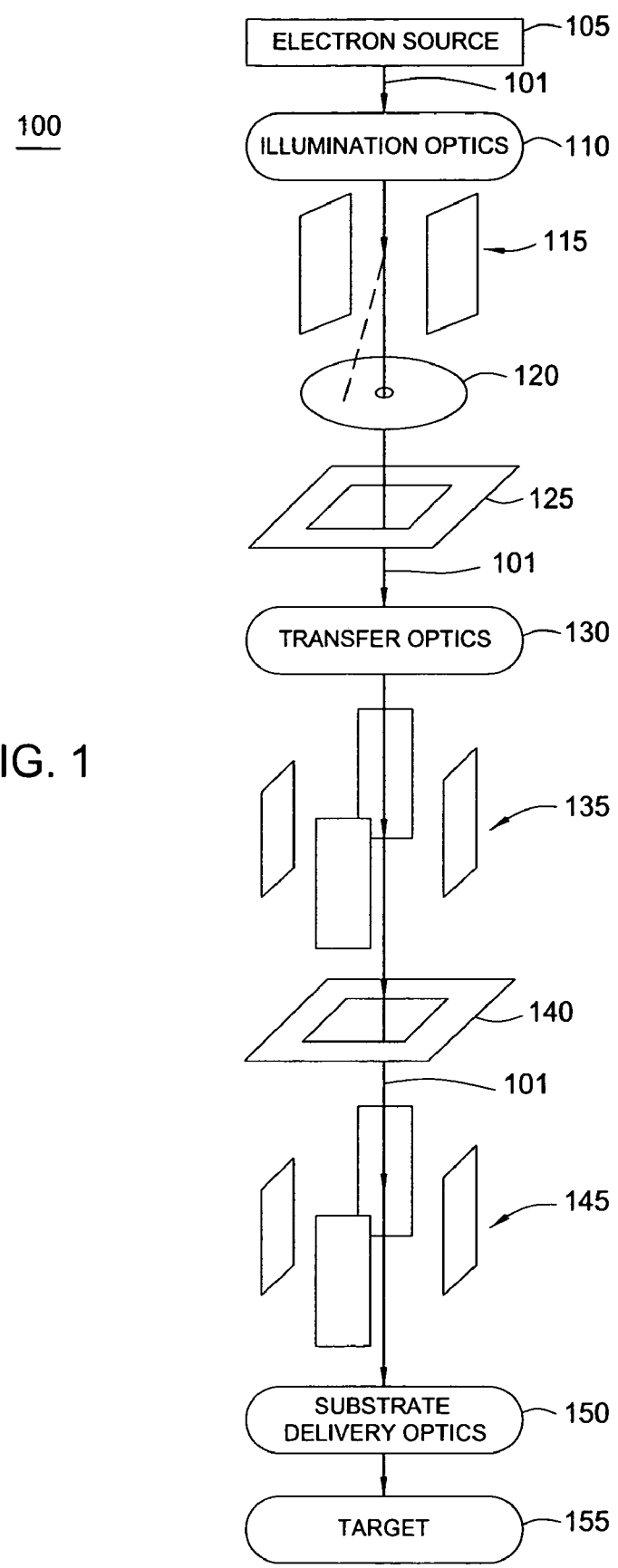
FIG. 1 is a schematic view of an electron beam column in connection with one or more embodiments of the present invention.

Electron beam systems generally have an electron beam column configured to shape electron beams and to move shaped electron beams to desired locations on a target. FIG. 1 is a schematic view of an electron beam column 100 in connection with one or more embodiments of the present invention. The electron beam column 100 includes an electron beam source 105 adapted to generate an electron beam 101, illumination optics 110, a blanking deflector 115, a blanking aperture 120, an upper aperture 125, transfer optics 130, a shape deflector 135, a lower aperture 140, a vector deflector 145 and delivery optics 150.

The electron beam source 105 may be a thermal field emission source, thermal emission source or field emission source. The illumination optics 110 are configured to assist the electron beam source 105 to illuminate the upper aperture 125, while the transfer optics 130 are configured to project the electron beam 101 through the upper aperture 125 onto the lower aperture 140. The delivery optics 150 are configured to project the deflected electron beam 101 to a target 155. The blanking aperture 120 is configured to prevent electron beams from reaching the upper aperture 125. The upper aperture 125 and the lower aperture 140 are configured to form the shape of the electron beam 101.

There are three sets of deflectors in the electron beam column 100, the blanking deflector 115, the shape deflector 135 and the vector deflector 145. The blanking deflector 115 is configured to deflect the electron beams 101 in the onto the blanking aperture 120, e.g. along line 102, so that the electron beam 101 is prevented from reaching the target 155. The shape deflector 135 and the vector deflector 145 are configured to shape and move the electron beam 101 in response to the signals generated by a flash generator. More specifically, the shape deflector 135 is configured to move the electron beam 101 such that the overlap of the image or shadow of the upper aperture 125 with the lower aperture 140 can be modified. The electron beam 101 that passes through the lower aperture 140 has the shape of the overlap of the image of the upper aperture 125 with the lower aperture 140. In this manner, the shape deflector 135 is configured to shape the electron beam 101. The vector deflector 145 is configured to move the shaped electron beam 101 to the desired location on the target 155. The movement and shaping of the electron beam 101 is provided in more details in paragraphs 0025–0034 of U.S. patent application Ser. No. 10/996,020, filed in Nov. 22, 2004, entitled "Method for Elimination Low Frequency Error Sources to Critical Dimension Uniformity in Shaped Beam Writing Systems", which is incorporated by reference.

Exemplary Beam Deflectors

Figure 4:
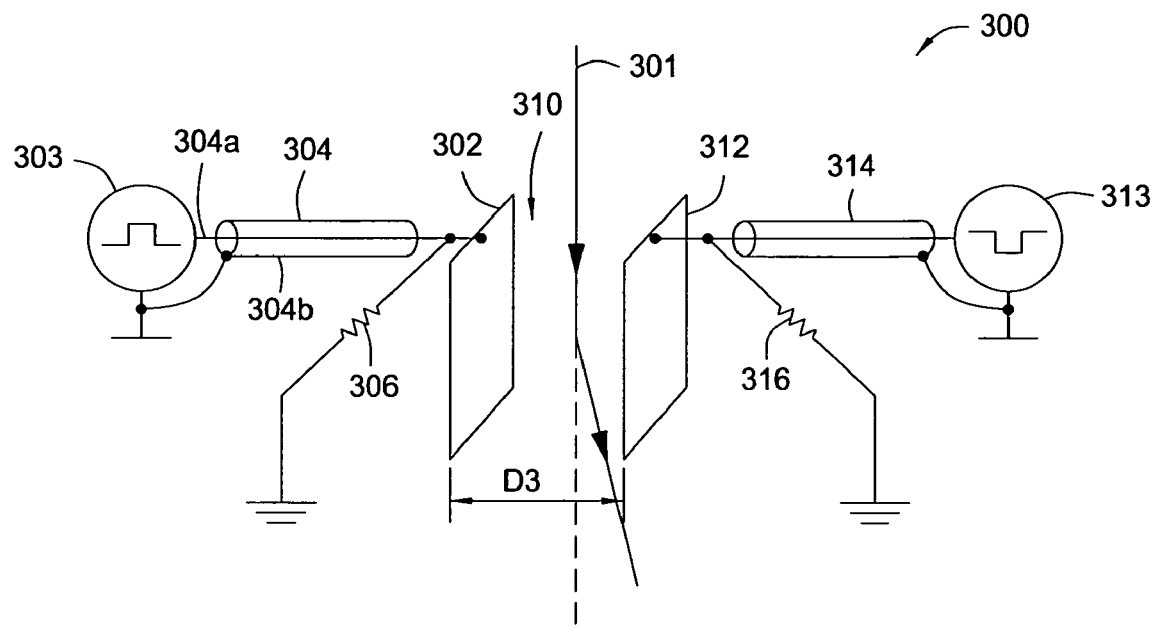
FIG. 4 is a schematic view of an exemplary embodiment of an electron beam deflection system of the present invention.
Figure 5:
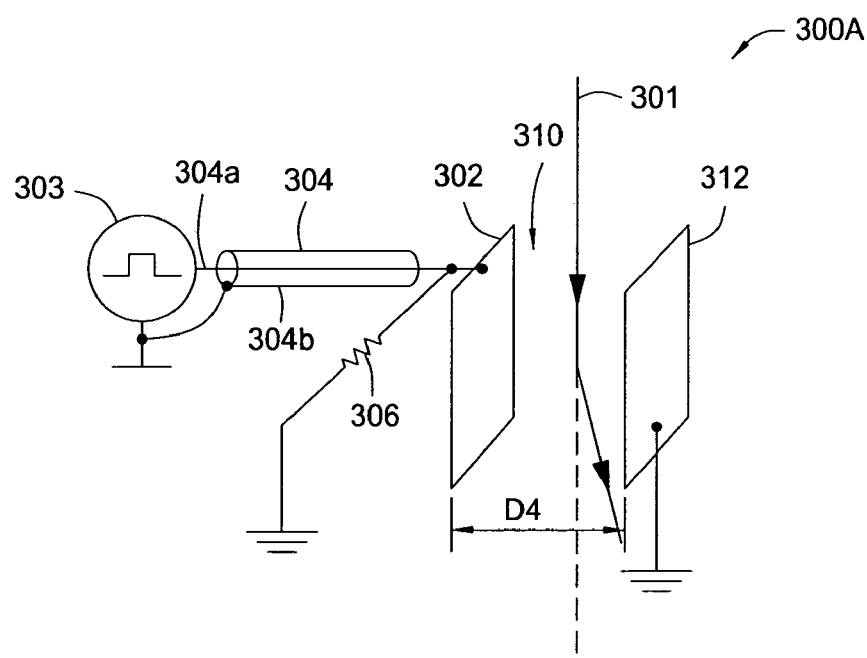
FIG. 5 is a schematic view of an exemplary embodiment of an electron beam deflection system of the present invention.

Generally, a blanking deflector has one pair of deflecting electrodes. A shape deflector and a vector deflector may have at least two pairs of deflecting electrodes. FIGS. 4 and 5 illustrate embodiments of a pair of deflecting electrodes which can be used in a blanking deflector, a shape deflector or a vector deflector of an electron beam column. While the deflector electrodes are schematically illustrated as flat panels (plates), other shapes, such as curved arcs of a circle, are also contemplated.

Referring first to FIG. 4, a schematic view of a deflection system 300, in accordance with one embodiment of the present invention is shown. Electrodes 302 and 312 are disposed opposing to one another and form a capacitor 310 configured to deflect an electron beam 301 that passes through between the electrodes 302 and 312. A signal source 303 adapted to supply a deflection signal is connected to a termination resistor 306 via a drive coaxial cable 304. The termination resistor 306 is further connected to the ground. The electrode 302 is connected to both of the termination resistor 306 and the drive coaxial cable 304 at point 307 where the termination resistor 306 connects the drive coaxial cable 304.

In one embodiment, a T-piece may be used at point 307 with the termination resistor 306, the drive coaxial cable 304 and the electrode 302 each connecting to one leg of the T-piece. Similarly, a signal source 313 is adapted to supply a deflection signal to the electrode 312 in the same manner via a termination resistor 316 and a drive coaxial cable 314. The termination resistors 306 and 316 is configured to match the impedance of the drive coaxial cable 304 and 314 respectively. The impedance of the electrodes 302 and 312 are matched to half of the impedance of the coaxial cables 304 and 314 respectively.

As a result, there will only be attenuation resulting from the reflection of forward moving waves. Reflected signals at points 307 and 317 see two parallel lines each having the impedance of the drive coaxial cables 304 and 314, which corresponds to the impedance between the electrodes 302 and 312. Because the termination resistors 306 and 316 are outside the electrodes 302 and 312, no current flows through the electrodes 302 and 312 in static mode and only a small current flows through the electrodes 302 and 312 during voltage switching. Therefore, only very small eddy currents are created in neighboring materials during switching compared to the state-of-the-art deflection systems.

Figure 2:
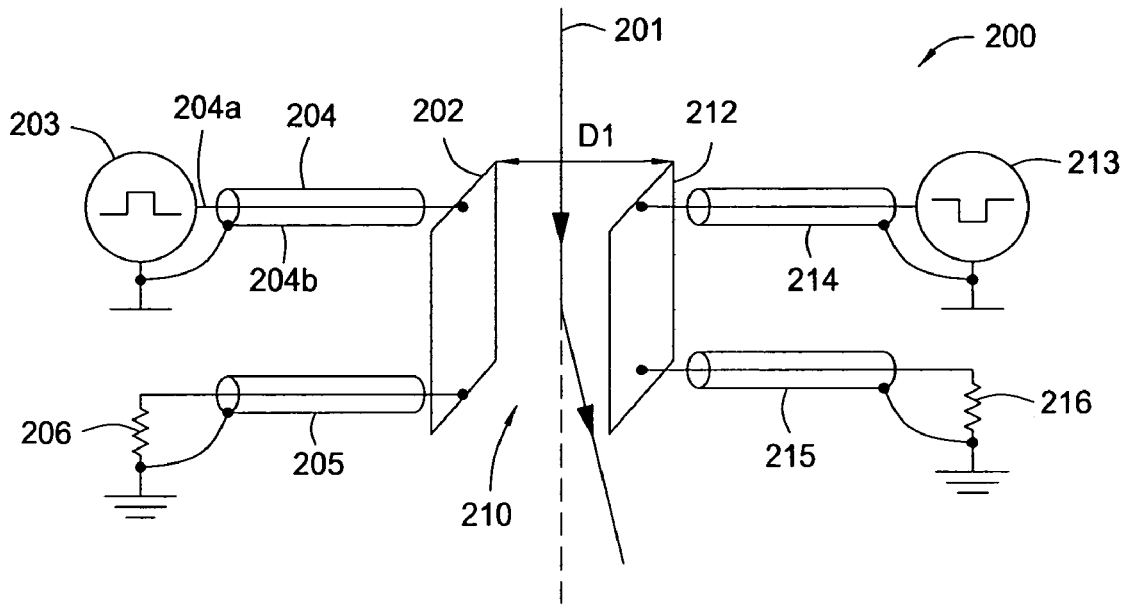
FIG. 2 is a schematic view of an electron beam deflection system.
Figure 3:
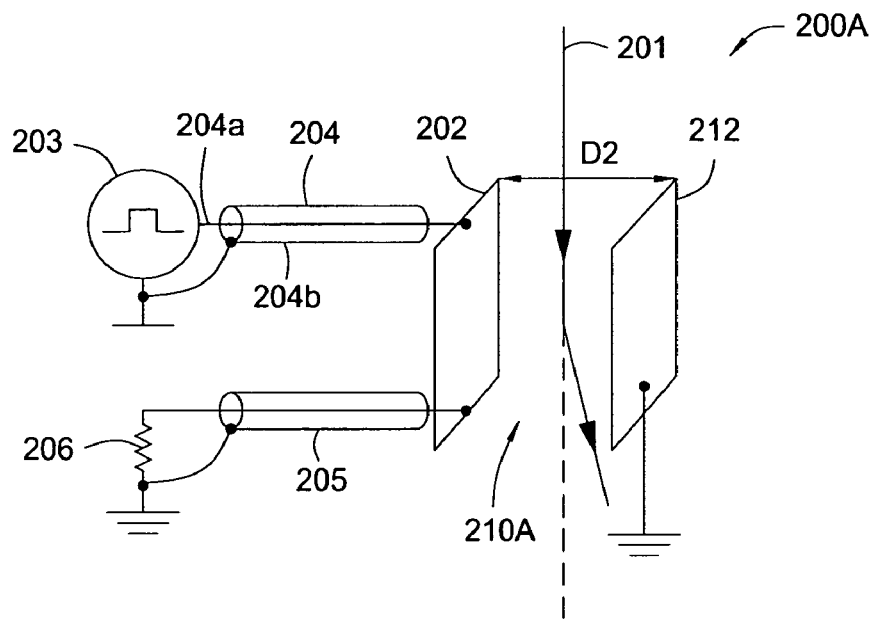
FIG. 3 is a schematic view of an electron beam deflection system.

Usually, the drive coaxial cables 304 are 314 are 50 Ohm coaxial cables, and the termination resistors 306 and 316 are equivalent to 50 Ohm resistors. The impedance between each electrode 302 or 312 and the ground is 25 Ohm respectively. The signal source 303 outputs a deflection signal that is inverted to a deflection signal from the signal source 313 such that the driven force produced by the capacitor 310 to deflect the electron beam 301 may double the capacity of each signal sources 303 and 313. The voltage at the middle points between the electrodes 302 and 312 equals to the ground. Thus, the capacitor 310 may be considered as two capacitors (302-ground, and ground-312) in series, each having an impedance of 25 Ohm. Therefore, the impedance of the capacitor 310 is 50 Ohm, or the same as the coaxial cable used and half of the capacitor 210 in FIG. 2. Thus, distance D3 between the electrodes 302 and 312 is half of the distance D1 of FIG. 2 if other parameters are kept the same.

FIG. 5 is a schematic view of a deflection system 300A, in accordance with another embodiment of the present invention. For ease of understanding, identical or similar features are identified by the same numerals in FIGS. 4 and 5. The deflection system 300A is similar to the deflection system 300 in FIG. 4. However, only one signal source 303 is used in the deflection system 300A. The electrode 312 is grounded. Therefore, the electrodes 302 and 312 form a capacitor 310A having an impedance matched to that of parallel circuit of the drive coaxial cable 304 and the termination resistor 306. The distance between the electrodes 302 and 312 is D4, which is half of D3 of FIG. 4 if the same kind of coaxial cables are used in both systems.

Figure 6:
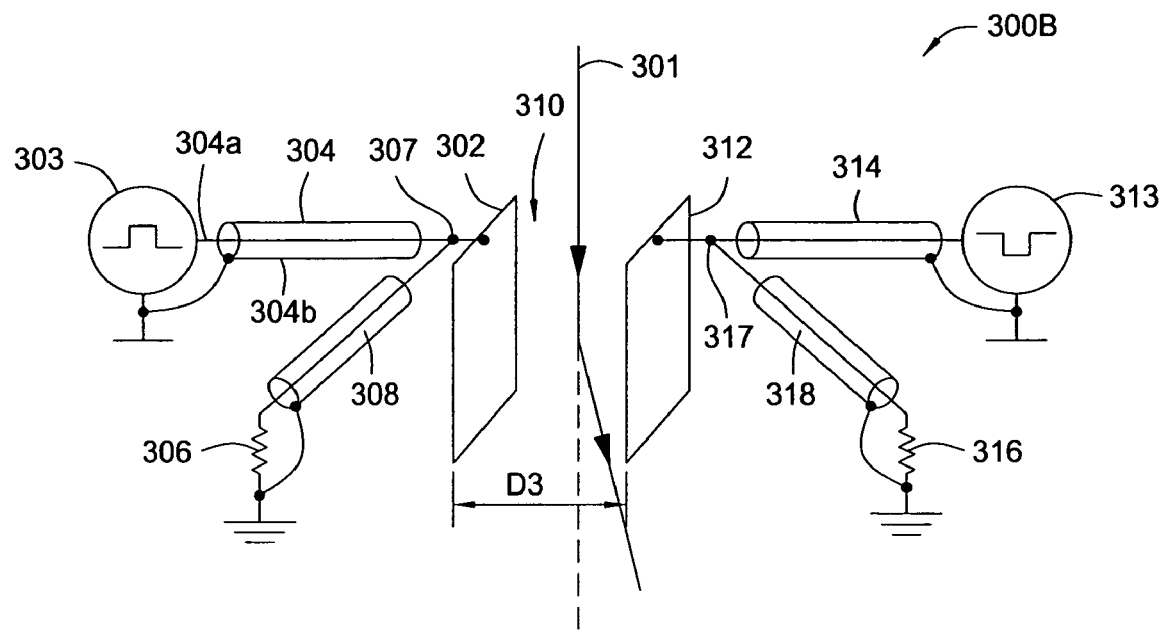
FIG. 6 is a schematic view of an exemplary embodiment of an electron beam deflection system of the present invention.

FIG. 6 is a schematic view of a deflection system 300B, in accordance with another embodiment of the present invention. For ease of understanding, identical or similar features are identified by the same numerals in FIGS. 4 and 6. In the deflection system 300B, a return coaxial cable 308 is used to connect the termination resistor 306 and the point 307. The return coaxial cable 308 having the same impedance as the drive coaxial cable 304 so that impedance is still matched at the point 307 and between the coaxial cable 308 and the termination resistor 306 which is configured to matched to impedance of the drive coaxial cable 304. By using the return coaxial cable 308, the termination resistor 306 may be positioned in a convenient location away from the electrode 302 where power can be easily removed to a heat sink. Similarly, a return coaxial cable 318 having the same impedance of the drive coaxial cable 314 is used in connecting the termination resistor 316 and the electrode 312.

Figure 7:
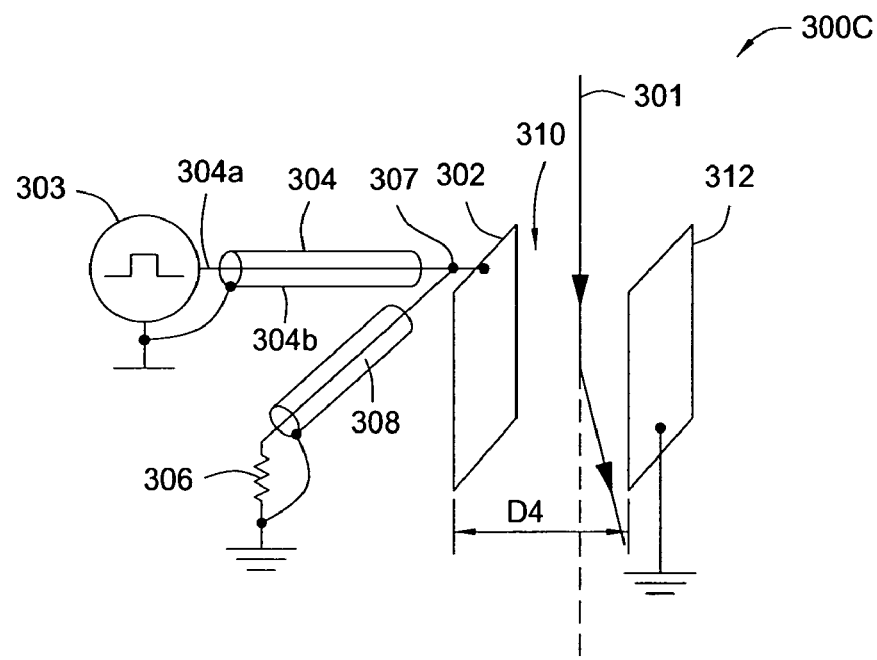
FIG. 7 is a schematic view of an exemplary embodiment of an electron beam deflection system of the present invention.

FIG. 7 is a schematic view of a deflection system 300C, in accordance with another embodiment of the present invention. For ease of understanding, identical or similar features are identified by the same numerals in FIGS. 5 and 7. In the deflection system 300C, a return coaxial cable 308 having the same impedance of the drive coaxial cable 304 is used to connect the termination resistor 306 and the electrode 302.

Therefore, the electron deflection system of the present invention overcomes the disadvantages of the state-of-the-art deflection systems discussed above. The effect of induced transient magnetic fields is minimized because no current flows through the electrodes of the capacitor, thus, improving the precision and shortening the settling time. The system is simplified for only one connector is required for each electrode. The spacing between the capacitor electrodes is reduced by a factor of approximately two compared to the state-of-the-art systems.

CONCLUSION

By connecting a single point of an electrode of a capacitor used to deflect the electron beam to a coaxial drive cable and one end of a termination resistor, current flow across the electrode may be prevented, thereby avoiding the inducement of eddy currents and associated transient magnetic fields. As a result, more precisely controlled beam deflection may be achieved. Further, by reducing the effective impedance seen by reflected signals, lower total capacitor impedance may be utilized, allowing correspondingly shorter distances between electrodes, which may simplify deflector design and manufacture.

While the foregoing is directed to embodiments of the present invention, other and further embodiments of the invention may be devised without departing from the basic scope thereof, and the scope thereof is determined by the claims that follow.

What is claimed is:

1. An apparatus for deflecting an electron beam, comprising:
   first and second opposing electrodes;
   a first signal source adapted to provide a first deflection signal;
   a first coaxial cable having a first impedance, wherein a first end of the first coaxial cable is electrically coupled to the first signal source and a second end of the first coaxial cable is electrically coupled to the first electrode; and
   a first termination component having an impedance matched to the first impedance, wherein a first end of the first termination component is electrically coupled to the second end of the first coaxial cable and a second end of the termination component is electrically coupled to a ground,
   wherein the first electrode having an impedance relative to the ground matched to approximately half of the first impedance.

2. The apparatus of claim 1, wherein the second electrode is grounded.

3. The apparatus of claim 1, further comprising:
   a second signal source adapted to provide a second deflection signal that is inverted relative to the first deflection signal;
   a second coaxial cable having a second impedance, wherein a first end of the second coaxial cable is electrically coupled to the second signal source and a second end of the second coaxial cable is electrically coupled to the second electrode; and
   a second termination component having an impedance matched to the second impedance, the second termination component having a first end electrically coupled to the second end of the second coaxial cable and having a second end electrically coupled to a ground, wherein an impedance between the first and second electrodes matches the first impedance.

4. The apparatus of claim 1, wherein the first termination component comprises a return coaxial cable having the first impedance adapted to connect the first coaxial cable.

5. The apparatus of claim 3, wherein:
   the first termination component comprises a return coaxial cable having the first impedance adapted to connect the first coaxial cable; and
   the second termination component comprises a return coaxial cable having the second impedance adapted to connect the second coaxial cable.

6. The apparatus of claim 1, wherein the first impedance is approximately 50 Ohms.

7. The apparatus of claim 3, wherein the first and second impedances are approximately 50 Ohms.

8. An apparatus for deflecting an electron beam, comprising:
   at least a first circuit, the first circuit comprising:
      a signal source;
      a termination component; and
      a drive cable connecting the signal source and the termination,
      wherein the drive cable has a first impedance, the termination component is grounded and has a resistance matched to the first impedance; and
   at least one pair of opposing electrodes adapted to deflect the electron beam,
   wherein one electrode in the at least one pair of electrodes is connected to the at least one first circuit such that the electrode is connected to the signal source via the drive cable.

9. The apparatus of claim 8, wherein the other electrode in the at least one pair of electrodes is grounded and the at least one pair of electrodes has an impedance matched to half of the first impedance.

10. The apparatus of claim 8, further comprising
    at least a second circuit, the second circuit comprising:
       a signal source adapted to provide a signal inverted relative to the signal source of the first circuit;
       a termination component; and
       a drive cable connecting the signal source and the termination,
       wherein the drive cable has a second impedance, the termination component is grounded and has a resistance matched to the second impedance,
    wherein the other electrode in the at least one pair of electrodes is connected to a respective one of the at least one second circuit such that the electrode is connected to the signal source via the drive cable.

11. The apparatus of claim 8, wherein:
    the termination component comprises a return cable having the first impedance; and
    the return cable is adapted to join the drive cable.

12. The apparatus of claim 8, wherein the drive cable is a coaxial cable and the first impedance is approximately 50 Ohms.

13. The apparatus of claim 10, wherein the termination component of each first circuit comprises a return cable having the first impedance, the return cable is adapted to join the drive cable.

14. The apparatus of claim 10, wherein:
    the drive cable of each first circuit is a coaxial cable;
    the first impedance is approximately 50 Ohms;
    the drive cable of each second circuit is a coaxial cable; and
    the second impedance is approximately 50 Ohms.

15. The apparatus of claim 8, wherein the at least one pair of electrodes comprises at least one of a blanking deflector, a vector deflector and a shape deflector.

16. The apparatus of claim 10, wherein the at least one pair of electrodes comprises at least one of a blanking deflector, a vector deflector and a shape deflector.

17. A method for providing an electric signal to a deflection system having multiple electrodes, the method comprising:

providing a first closed circuit, wherein a signal source, a coaxial cable and a termination component are connected in series;

connecting a first electrode to the first closed circuit at one point, wherein the one point is a joint connection point of the coaxial cable and the termination component, wherein the first electrode connected to the first closed circuit and the ground having an impedance matched to a parallel circuit of the coaxial cable and the termination component; and providing a first electric signal using the signal source in the first closed circuit.

18. The method of claim 17, further comprising:

grounding a second electrode opposing the first electrode connected to the first circuit.

19. The method of claim 17, further comprising:

providing a second closed circuit, wherein a signal source, a coaxial cable and a termination component are connected in series;

connecting a second electrode to the second closed circuit at one point, wherein the one point is a joint connection point of the coaxial cable and the termination component, and the second electrode connected to the second closed circuit is opposing to the first electrode connected to the first closed circuit; and providing an inverted signal of the first signal using the signal source in the second closed circuit.

20. The method of claim 17, further comprising providing a return coaxial cable in the termination component, wherein the return coaxial cable is adapted to connect the coaxial cable.

* * * * *

UNITED STATES PATENT AND TRADEMARK OFFICE
CERTIFICATE OF CORRECTION

PATENT NO. : 7,227,155 B2
APPLICATION NO. : 11/241789
DATED : June 5, 2007
INVENTOR(S) : Buller et al.

It is certified that error appears in the above-identified patent and that said Letters Patent is hereby corrected as shown below:

In the Specification:

In Column 1, Line 26, please delete the second "an" and insert --a--;

In Column 1, Line 30, please delete "miminal" and insert --minimal--;

In Column 1, Line 31, please delete "consists" and insert --consists of--;

In Column 1, Line 33, please delete "electric" and insert --electric field--;

In Column 2, Line 23, please delete "a long" and insert --along--;

In Column 3, Line 40, please delete "of" and insert --of the invention--;

In Column 4, Line 67, please delete ". ." and insert --.--;

In Column 5, Lines 4-5, please delete "in the onto the" and insert --onto the--;

In Column 5, Line 21, please delete "details" and insert --detail--;

In Column 5, Line 57, please delete "is" and insert --are--;

In Column 5, Line 58, please delete "cable" and insert --cables--;

In Column 6, Line 7, please delete "304 are 314" and insert --304 and 314--;

UNITED STATES PATENT AND TRADEMARK OFFICE
CERTIFICATE OF CORRECTION

PATENT NO. : 7,227,155 B2
APPLICATION NO. : 11/241789
DATED : June 5, 2007
INVENTOR(S) : Buller et al.

It is certified that error appears in the above-identified patent and that said Letters Patent is hereby corrected as shown below:

In the Specification (cont'd):

In Column 6, Lines 47-48, please delete "to matched to impedance" and insert --to be matched to the impedance--.

Signed and Sealed this

Fourteenth Day of August, 2007

JON W. DUDAS
*Director of the United States Patent and Trademark Office*